United States Patent
Palaniswamy et al.

(10) Patent No.: US 10,121,947 B2
(45) Date of Patent: Nov. 6, 2018

(54) FLEXIBLE LED ASSEMBLY WITH UV PROTECTION

(71) Applicant: 3M INNOVATIVE PROPERTIES COMPANY, St. Paul, MN (US)

(72) Inventors: Ravi Palaniswamy, Singapore (SG); Alejandro Aldrin Il Agcaoili Narag, Singapore (SG); Siang Sin Foo, Singapore (SG); Hiromitsu Kosugi, Tokyo (JP)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/316,028

(22) PCT Filed: May 26, 2015

(86) PCT No.: PCT/US2015/032363
§ 371 (c)(1),
(2) Date: Dec. 2, 2016

(87) PCT Pub. No.: WO2015/191273
PCT Pub. Date: Dec. 17, 2015

(65) Prior Publication Data
US 2017/0104143 A1    Apr. 13, 2017

Related U.S. Application Data

(60) Provisional application No. 62/010,224, filed on Jun. 10, 2014.

(51) Int. Cl.
*H01L 33/62* (2010.01)
*B32B 15/08* (2006.01)
(Continued)

(52) U.S. Cl.
CPC ............. *H01L 33/62* (2013.01); *B32B 7/12* (2013.01); *B32B 15/08* (2013.01); *B32B 27/281* (2013.01);
(Continued)

(58) Field of Classification Search
None
See application file for complete search history.

(56) References Cited

U.S. PATENT DOCUMENTS 4,713,284 A * 12/1987 Hasegawa ............... B32B 15/08
442/233
9,716,061 B2 * 7/2017 Palaniswamy .... H01L 23/49838
(Continued)

FOREIGN PATENT DOCUMENTS

| DE | 3644310 | 7/1987 |
|---|---|---|
| EP | 2490513 | 8/2012 |

(Continued)

OTHER PUBLICATIONS

International Search Report for PCT International Application No. PCT/US2015/032363 dated Aug. 18, 2015, 4 pages.

*Primary Examiner* — Bilkis Jahan
(74) *Attorney, Agent, or Firm* — Clifton F. Richardson

(57) ABSTRACT

Flexible LED assemblies (300) are described. More particularly, flexible LED (320) assemblies having flexible substrates (302) with conductive features (304, 306) positioned on or in the substrate, and layers of ceramic (310) positioned over exposed portions of the substrate to protect against UV degradation, as well as methods of making such assembles, are described.

18 Claims, 3 Drawing Sheets

(51) Int. Cl.
    *B32B 7/12*         (2006.01)
    *B32B 27/28*      (2006.01)
    *H01L 33/48*      (2010.01)
    *H01L 33/58*      (2010.01)
    *H05K 1/03*        (2006.01)
    *H05K 1/18*        (2006.01)
    *H05K 3/28*        (2006.01)

(52) U.S. Cl.
    CPC ............ *H01L 33/486* (2013.01); *H01L 33/58* (2013.01); *H05K 1/036* (2013.01); *B32B 2255/10* (2013.01); *B32B 2255/20* (2013.01); *B32B 2307/202* (2013.01); *B32B 2457/202* (2013.01); *H01L 2933/0033* (2013.01); *H01L 2933/0058* (2013.01); *H01L 2933/0066* (2013.01); *H05K 1/0306* (2013.01); *H05K 1/0346* (2013.01); *H05K 1/189* (2013.01); *H05K 3/28* (2013.01); *H05K 2201/017* (2013.01); *H05K 2201/0154* (2013.01); *H05K 2201/0179* (2013.01); *H05K 2201/09827* (2013.01); *H05K 2201/09881* (2013.01); *H05K 2201/10106* (2013.01)

(56) References Cited

U.S. PATENT DOCUMENTS

| | | | |
|---|---|---|---|
| 2004/0108810 A1* | 6/2004 | Tsujimura | ........... H01L 27/3248 313/506 |
| 2006/0231837 A1 | 10/2006 | Wuchse et al. | |
| 2009/0159321 A1 | 6/2009 | Hance et al. | |
| 2012/0211268 A1* | 8/2012 | Halahmi | ............... H05K 1/0306 174/260 |
| 2013/0213697 A1* | 8/2013 | Palaniswamy | ........ H01L 33/486 174/254 |

FOREIGN PATENT DOCUMENTS

| WO | WO 2012-112873 | 8/2012 |
|---|---|---|
| WO | WO 2013-078180 | 5/2013 |
| WO | WO 2015-191273 | 12/2015 |

\* cited by examiner

FLEXIBLE LED ASSEMBLY WITH UV PROTECTION

FIELD

The present description relates to flexible LED assemblies.

BACKGROUND

Flexible circuits and assemblies are often used as connectors in various applications of electronics equipment, such as printers, computers, monitors and the like. Such circuits offer a benefit over previously used rigid circuit boards in both flexibility and space savings.

The move to more highly flexible materials for circuits has created challenges, such as the greater degradation of, e.g., a flexible polyimide substrate versus a conventional ceramic substrate when exposed to UV light from LEDs mounted to such circuits. The present description aims to provide a solution that maintains the flexibility of the LED while preventing degradation of the circuitry substrate.

SUMMARY

In one aspect, the present description relates to a flexible LED assembly. The flexible LED assembly includes a flexible polymer substrate, a first and second conductive feature and a layer of ceramic. First conductive feature is positioned within and on a surface of the flexible substrate. Second conductive feature is positioned within and on the surface of the flexible substrate at a distance from the first conductive feature, such that a portion of the flexible polymer substrate between the first and second conductive features is exposed. A layer of ceramic is positioned on the exposed flexible polymer surface between the first and second conductive features.

In another aspect, the present description relates to a flexible LED assembly. The flexible LED assembly includes a flexible polymer substrate, a first conductive feature and a layer of ceramic. The flexible polymer substrate has a via that extends through it. First conductive feature is positioned on a bottom surface of the flexible substrate and a portion of the first conductive feature is positioned beneath the via. The layer of ceramic is positioned on the top surface of the flexible polymer substrate. Optionally, the assembly may include a second via in the flexible polymer substrate and a second conductive feature positioned on a bottom surface of the flexible substrate, where a portion of the second conductive feature is positioned beneath the second via.

In yet another aspect, the present description relates to a method of making an LED assembly. The method includes the steps of applying a layer of ceramic to the surface of a substrate, the substrate comprising, prior to application of the ceramic, first portions on which the exposed top surface is polymer and second portions on which the exposed top surface is a conductive metal, removing the ceramic from the second portions of the surface of the substrate, and surface finishing the conductive metal in the second portions of the surface of the substrate.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
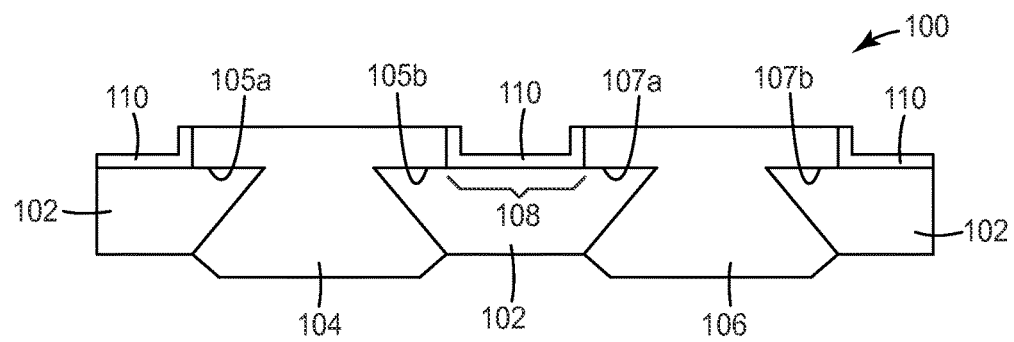
FIG. 1 is a cross-sectional view of a flexible LED assembly according to the present description.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

FIG. 1 provides a cross-sectional view of a flexible LED assembly 100 according to the present description. Flexible LED assembly 100 includes a flexible polymer substrate 102. Flexible polymer substrate 102 may, in a preferred embodiment, be made of polyimide. Alternatively, substrate 102 may be PET, liquid crystalline polymer, polycarbonate, polyether ether ketone, thermoplastic polymer, or another appropriate flexible material. Flexible polymer substrate 102 will generally be a dielectric material. Assembly 100 includes a first conductive feature 104 that is positioned within and on a surface of the flexible substrate 102. For example, first conductive feature is clearly positioned within the plane of the substrate but also is positioned on surface portions 105a, 105b of substrate 102. Assembly 100 further includes a second conductive feature 106 that is also positioned within and on the surface (see, e.g., surface portions 107a, 107b) of the flexible substrate.

Second conductive feature is positioned at a distance from the first conductive feature 104, such that a portion of the flexible polymer substrate between the first and second conductive feature 108 is exposed. In at least one embodiment, the first and second conductive features may be made up of copper, although other conductive materials may be used. Finally, a layer of ceramic 110 is positioned on the exposed flexible polymer surface 108 between the first and second conductive features. Ceramic 110 may also be positioned on the surface of the substrate the opposite sides of first and second conductive features, such that any exposed portion of the flexible substrate 102 is covered with ceramic. In certain embodiments, ceramic 110 may be $Al_2O_3$, AlN, or BN, each of which provides appropriate UV shielding capabilities, though other ceramics with UV-shielding properties may be utilized.

Figure 2:
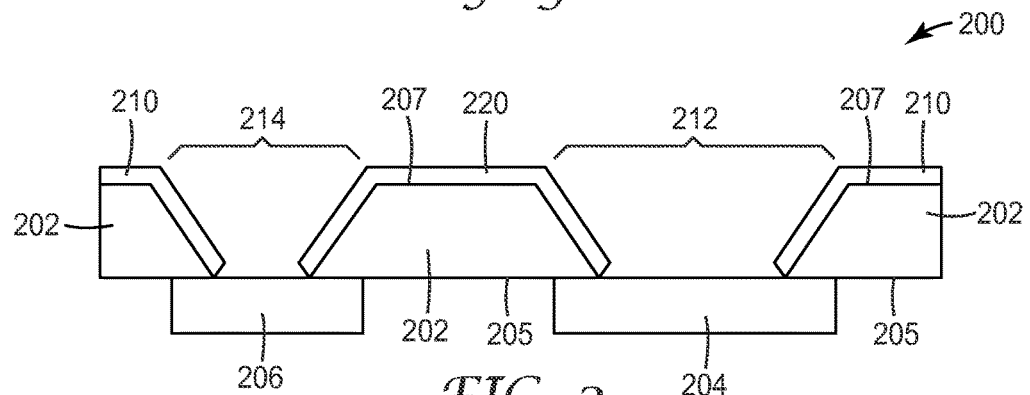
FIG. 2 is a cross-sectional view of a flexible LED assembly according to the present description.

FIG. 2 illustrates another embodiment of a flexible LED assembly 200 according to the present description. In this embodiment, the flexible LED assembly includes a flexible polymer substrate 202 with a via 212 extending therethrough. A first conductive feature 204 is positioned on a bottom surface 205 of the flexible substrate, and a portion of the conductive feature 204 is positioned beneath the via 212. A layer of ceramic 210 is positioned on the top surface 207 of the flexible polymer substrate. Additionally, flexible LED assembly 200 may include a second via 214 in the flexible polymer substrate, and a second conductive feature 206 positioned on a bottom surface 205 of the flexible substrate. At least a portion of second conductive feature 206 is positioned beneath the second via 214. First and second conductive features may have the properties described with respect to the conductive features in assembly 100, as may ceramic layer, and flexible polymer substrate (to the corresponding features with the same name).

Figure 3:
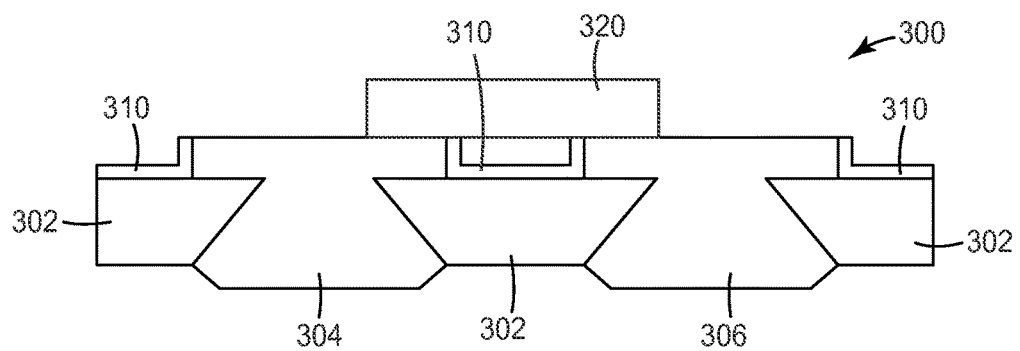
FIG. 3 is a cross-sectional view of a flexible LED assembly according to the present description.

Of course, as the construction in FIGS. 1 and 2 illustrate flexible LED assemblies, ultimately an LED will be mounted to the constructions. A number of appropriate LED constructions may be used. FIG. 3 illustrates one such construction. Flexible LED assembly 300 includes an LED 320 that is mounted on both first conductive feature 304 and second conductive feature 306. Flexible polymer substrate 302 is shielded from UV light emitted from LED 320 by layer of ceramic 310. This particular construction may be one in which the LED 320 is a flip chip or a lateral die. Where the LED 320 is a flip chip, it may be bonded to first conductive feature 304 and second conductive feature 306 using a soldering technique. Alternatively, the LED may be eutectic bonded to the first and second conductive features.

Figure 4:
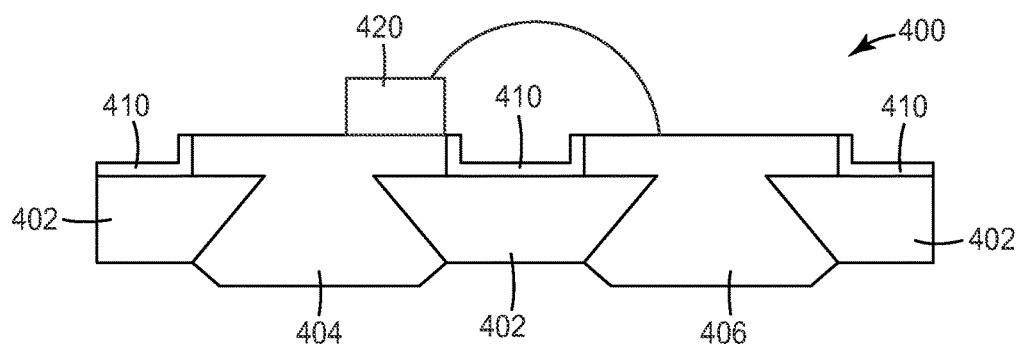
FIG. 4 is a cross-sectional view of a flexible LED assembly according to the present description.

In a different embodiment, the LED may be wire bonded to one or both of the first and second conductive features. FIG. 4 illustrates one exemplary construction. In this case, Flexible LED assembly 400 includes an LED 420 that is mounted on the first conductive feature 404, but not on the second conductive feature 406. As in the other constructions, the flexible polymer substrate 402 is shielded from UV light emitted from the LED by the layer of ceramic. However, here the LED is wire bonded to second conductive feature 406. It may also be wire bonded to first conductive feature 404, or may be attached to the first conductive feature using epoxy binding adhesive, conductive paste, anisotropic conductive paste (ACP), anisotropic conductive film (ACF) or eutectic bonding.

Figure 5A:
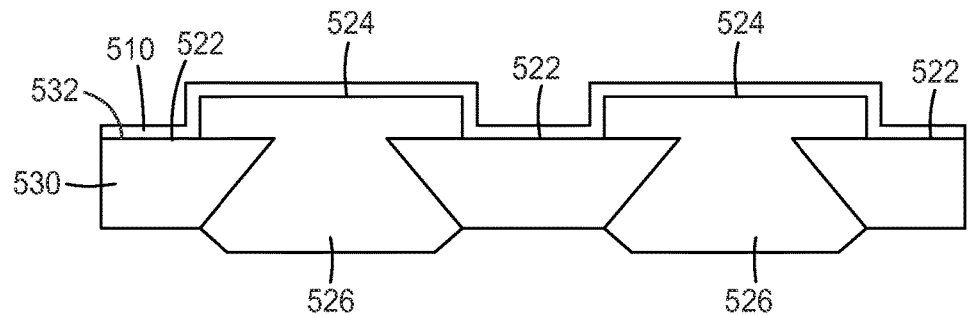
FIGS. 5a-5c provide a flow chart illustrating a method of making a flexible LED assembly according to the present description.
Figure 5B:
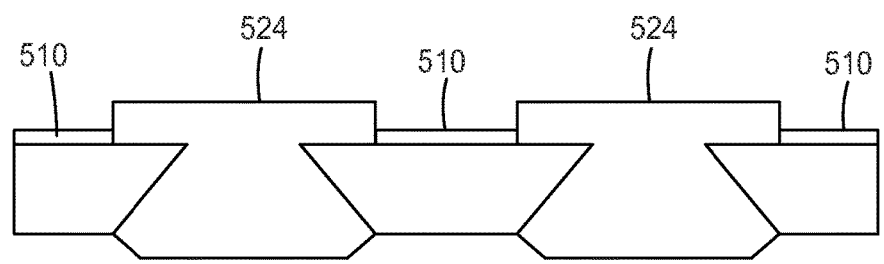
Figure 5C:
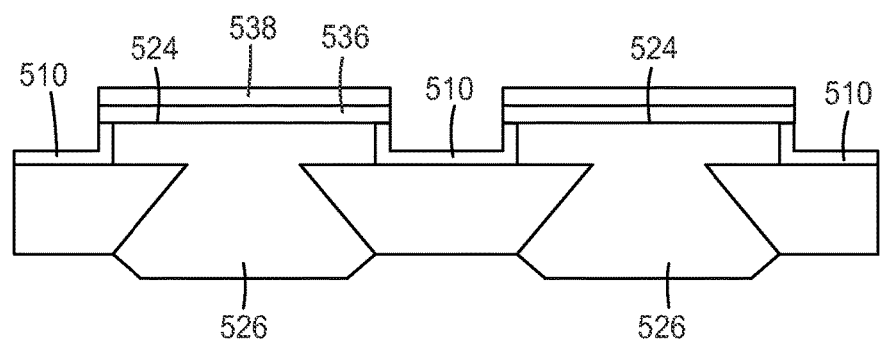

In another aspect, the present description relates to a method of making an LED assembly. Such a method is illustrated in FIGS. 5a-5c. The first step in the method, as illustrated in FIG. 5a, is applying a layer of ceramic 510 to the surface 532 of the substrate 530, where the substrate includes, prior to application of ceramic 510, first portions on which the exposed top surface is polymer (i.e. first portions 522), and second portions on which the exposed top surface is a conductive metal 526 (i.e. second portions 524). In one embodiment, ceramic layer 510 may be applied using a sputtering process. The ceramic layer 510 applied may be any appropriate material described with respect to ceramic layer 110, for example, aluminum nitride. In one exemplary embodiment, conductive metal 526 may be copper.

The next step, shown in FIG. 5b, is to remove the ceramic 510 from the second portions 524 of the surface of the substrate. The removal step may be accomplished through a number of appropriate means. For example, in one case, a tacky liner may be laminated onto the regions of the ceramic 510 that correspond to the second portions. When the tacky liner is removed, it peels away the ceramic covering second portions 524. Alternatively, the ceramic 510 may be removed from over second portions using a bristle brush technique, i.e., mechanically brushing off the ceramic using an abrasive substrate. In yet another case, the ceramic layer may be removed from over the second portion 524 using a micro-etching process.

Next, the method includes surface finishing the conductive metal 526 in the second portions 524 of the surface of the substrate. As illustrated, surface finishing may involve doing some sort of plating on second portion 524 of the surface. For example, surface finishing may include plating by means of electroless plating, electroplating or immersion plating. In one embodiment (shown by way of example in FIG. 5c), surface finishing may include first plating a layer of nickel 536, and then plating a layer of gold or silver 538.

Figure 6A:
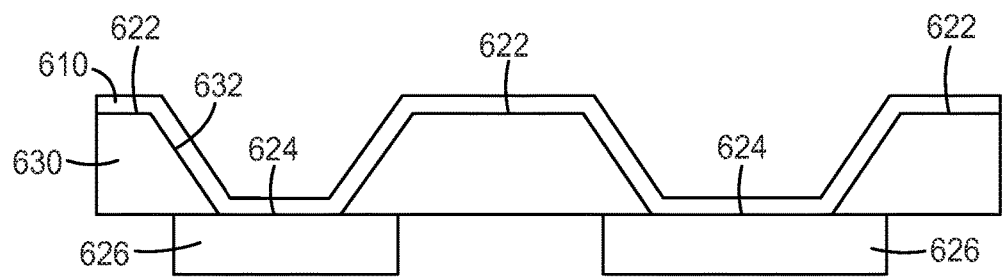
FIGS. 6a-6c provide a flow chart illustrating a method of making a flexible LED assembly according to the present description.
Figure 6B:
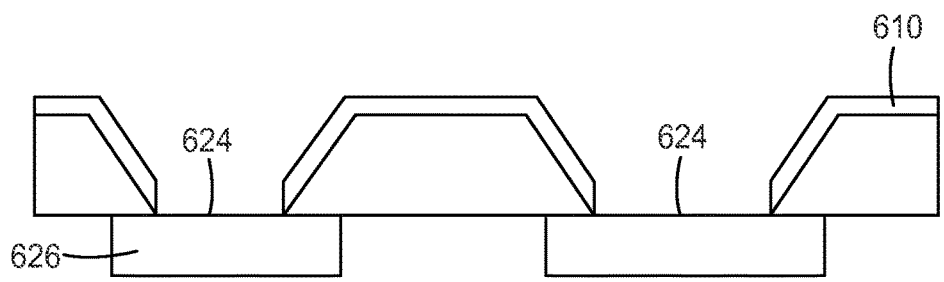
Figure 6C:
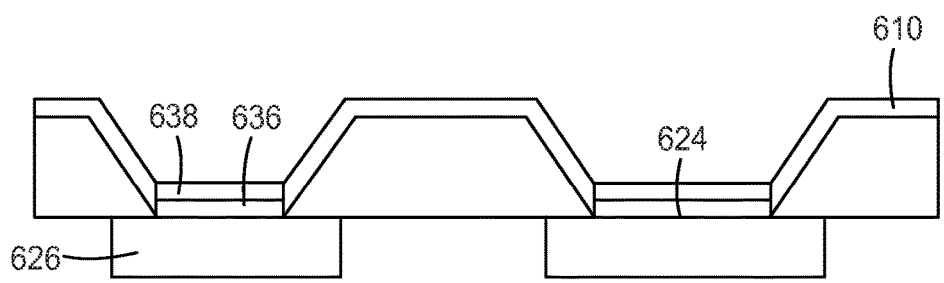

The same sort of process may also be used to a flexible LED assembly similar to that illustrated in FIG. 2. Such a process is illustrated in FIGS. 6a-6c. Here, again the first step (illustrated in FIG. 6a) is applying a layer of ceramic 610 to the surface 632 of the substrate 630, where the substrate includes, prior to application of ceramic 610, first portions on which the exposed top surface is polymer (i.e. first portions 622), and second portions on which the exposed top surface is a conductive metal 626 (i.e. second portions 624).

The next step, shown in FIG. 6b, is to remove the ceramic 610 from the second portions 624 of the surface of the substrate. The removal step may be accomplished through a number of appropriate means, such as those described above with respect to FIG. 5b.

Finally, the method includes surface finishing the conductive metal 626 in the second portions 624 of the surface of the substrate. As illustrated, surface finishing may involve doing some sort of plating on second portion 624 of the surface. For example, surface finishing may include plating by means of electroless plating, electroplating or immersion plating. In one embodiment (shown by way of example in FIG. 6c), surface finishing may include first plating a layer of nickel 636, and then plating a layer of gold or silver 638.

The following is a list of exemplary embodiments.

Embodiment 1 is a flexible LED assembly comprising:
a flexible polymer substrate;
a first conductive feature positioned within and on a surface of the flexible substrate;
a second conductive feature positioned within and on the surface of the flexible substrate at a distance from the first conductive feature, such that a portion of the flexible polymer substrate between the first and second conductive features is exposed; and
a layer of ceramic positioned on the exposed flexible polymer surface between the first and second conductive features.

Embodiment 2 is the flexible LED assembly of embodiment 1, further comprising an LED mounted on both the first and second conductive features, wherein the flexible polymer substrate is shielded from UV light emitted from the LED by the layer of ceramic.

Embodiment 3 is the flexible LED assembly of embodiment 1, wherein the flexible polymer substrate comprises polyimide.

Embodiment 4 is the flexible LED assembly of embodiment 1, wherein the flexible polymer substrate comprises PET, liquid crystalline polymer, polycarbonate, polyether ether ketone, or thermoplastic polymer.

Embodiment 5 is the flexible LED assembly of embodiment 1, wherein the first and second conductive features comprise copper.

Embodiment 6 is the flexible LED assembly of embodiment 1, wherein the ceramic comprises $Al_2O_3$, AlN, or BN.

Embodiment 7 is the flexible LED assembly of embodiment 2, wherein the LED comprises a flip chip.

Embodiment 8 is the flexible LED assembly of embodiment 7, wherein the flip chip is bonded using a soldering technique.

Embodiment 9 is the flexible LED assembly of embodiment 2, wherein the LED comprises a wire bonded LED.

Embodiment 10 is the flexible LED assembly of embodiment 2, wherein the LED comprises a lateral die.

Embodiment 11 is the flexible LED assembly of embodiment 2, wherein the LED is eutectic bonded to the first and second conductive features.

Embodiment 12 is the flexible LED assembly of embodiment 1, further comprising an LED that is mounted on first conductive feature but not the second conductive feature, wherein the flexible polymer substrate is shielded from UV light emitted from the LED by the layer of ceramic.

Embodiment 13 is the flexible LED assembly of embodiment 12, wherein the LED is attached to the first conductive feature using epoxy binding adhesive, conductive paste, anisotropic conductive paste (ACP), anisotropic conductive film (ACF) or eutectic bonding.

Embodiment 14 is the flexible LED assembly of embodiment 1, wherein the flexible polymer substrate comprises a dielectric.

Embodiment 15 is a flexible LED assembly comprising:
a flexible polymer substrate comprising a via extending therethrough;
a first conductive feature positioned on a bottom surface of the flexible substrate, a portion of the first conductive feature being positioned beneath the via;
and
a layer of ceramic positioned on the top surface of the flexible polymer substrate.

Embodiment 16 is the flexible LED assembly of embodiment 15, further comprising a second via in the flexible polymer substrate, and a second conductive feature positioned on a bottom surface of the flexible substrate, a portion of the second conductive feature being positioned beneath the second via.

Embodiment 17 is a method of making an LED assembly, comprising:
applying a layer of ceramic to the surface of a substrate, the substrate comprising, prior to application of the ceramic, first portions on which the exposed top surface is polymer and second portions on which the exposed top surface is a conductive metal,
removing the ceramic from the second portions of the surface of the substrate, and
surface finishing the conductive metal in the second portions of the surface of the substrate.

Embodiment 18 is the method of embodiment 17, wherein removing the ceramic from the second portions of the surface of the substrate comprises laminating a tacky liner onto the regions of ceramic corresponding to the second portions, and peeling the ceramic from the second portions by removing the tacky liner.

Embodiment 19 is the method of embodiment 17, wherein removing the ceramic from the second portions of the surface of the substrate comprises utilizing a bristle brush technique.

Embodiment 20 is the method of embodiment 17, wherein removing the ceramic from the second portions of the surface of the substrate comprises micro-etching the ceramic.

Embodiment 21 is the method of embodiment 17, wherein the conductive metal comprises copper.

Embodiment 22 is the method of embodiment 17, wherein surface finishing the conductive metal comprises electroless plating, electroplating, or immersion plating.

Embodiment 23 is the method of embodiment 17, wherein surface finishing the conductive metal comprises first plating a layer of nickel and then plating a layer of gold or silver.

Embodiment 24 is the method of embodiment 17, wherein the layer of ceramic is applied using a sputtering process.

Embodiment 25 is the method of embodiment 17, wherein the ceramic comprises aluminum nitride.

The invention claimed is:
1. A flexible LED assembly comprising:
a flexible polymer substrate;
a first conductive feature positioned within and on a surface of the flexible substrate;
a second conductive feature positioned within and on the surface of the flexible substrate at a distance from the first conductive feature, such that a portion of the flexible polymer substrate between the first and second conductive features is exposed; and a ceramic layer positioned on the exposed flexible polymer surface between the first and second conductive features.

2. The flexible LED assembly of claim 1, further comprising an LED mounted on both the first and second conductive features, wherein the flexible polymer substrate is shielded from UV light emitted from the LED by the ceramic layer.

3. The flexible LED assembly of claim 1, wherein the flexible polymer substrate comprises polyimide.

4. The flexible LED assembly of claim 1, wherein the ceramic layer comprises $Al_2O_3$, AlN, or BN.

5. The flexible LED assembly of claim 2, wherein the LED comprises a flip chip solder bonded to the first and second conductive features.

6. The flexible LED assembly of claim 2, wherein the LED is eutectic bonded to the first and second conductive features.

7. The flexible LED assembly of claim 1, further comprising an LED that is mounted on the first conductive feature but not the second conductive feature, wherein the flexible polymer substrate is shielded from UV light emitted from the LED by the ceramic layer.

8. The flexible LED assembly of claim 7, wherein the LED is attached to the first conductive feature using epoxy binding adhesive, conductive paste, anisotropic conductive paste (ACP), anisotropic conductive film (ACF) or eutectic bonding.

9. A flexible LED assembly comprising:
a flexible polymer substrate comprising a via extending therethrough;
a first conductive feature positioned on a bottom surface of the flexible substrate, a portion of the first conductive feature being positioned beneath the via; and
a ceramic layer positioned on a top surface of the flexible polymer substrate.

10. The flexible LED assembly of claim 9, further comprising a second via in the flexible polymer substrate, and a second conductive feature positioned on a bottom surface of the flexible substrate, a portion of the second conductive feature being positioned beneath the second via.

11. The flexible LED assembly of claim 9, wherein the ceramic layer comprises a planar first portion and a planar second portion, the first portion disposed on the top surface of the flexible polymer substrate, the second portion extending from an end of the first portion, the first and second portions being noncoplanar.

12. The flexible LED assembly of claim 11, wherein the first and second portions define an oblique angle therebetween.

13. The flexible LED assembly of claim 9, wherein the ceramic layer is an aluminum nitride layer.

14. The flexible LED assembly of claim 1, wherein the ceramic layer comprises a planar first portion and a planar second portion, the first portion disposed on the exposed flexible polymer surface, the second portion extending from an end of the first portion, the first and second portions being noncoplanar.

15. The flexible LED assembly of claim 14, wherein the second portion extends in a direction away from the flexible substrate and conforms to a side of one of the first and second conductive features.

16. The flexible LED assembly of claim 1, further comprising an LED mounted on both the first and second conductive features, the LED comprising a lateral die.

17. The flexible LED assembly of claim 1, further comprising a wire bonded LED mounted on both the first and second conductive features.

18. The flexible LED assembly of claim 1, wherein the ceramic layer is an aluminum nitride layer.

* * * * *